US009299821B2

(12) United States Patent
Shealy et al.

(10) Patent No.: US 9,299,821 B2
(45) Date of Patent: Mar. 29, 2016

(54) GATED III-V SEMICONDUCTOR STRUCTURE AND METHOD

(75) Inventors: James R. Shealy, Ithaca, NY (US); Richard Brown, Ithaca, NY (US)

(73) Assignee: CORNELL UNIVERSITY, Ithaca, NY (US)

( * ) Notice: Subject to any disclaimer, the term of this patent is extended or adjusted under 35 U.S.C. 154(b) by 0 days.

(21) Appl. No.: 13/389,127

(22) PCT Filed: Jun. 22, 2011

(86) PCT No.: PCT/US2011/041376
§ 371 (c)(1),
(2), (4) Date: Mar. 8, 2013

(87) PCT Pub. No.: WO2011/163318
PCT Pub. Date: Dec. 29, 2011

(65) Prior Publication Data
US 2013/0153963 A1    Jun. 20, 2013

Related U.S. Application Data

(60) Provisional application No. 61/357,641, filed on Jun. 23, 2010.

(51) Int. Cl.
*H01L 21/02* (2006.01)
*H01L 29/778* (2006.01)
(Continued)

(52) U.S. Cl.
CPC ............ *H01L 29/778* (2013.01); *H01L 23/291* (2013.01); *H01L 29/66431* (2013.01);
(Continued)

(58) Field of Classification Search
USPC .......................................... 257/190, 200, 194
See application file for complete search history.

(56) References Cited

U.S. PATENT DOCUMENTS

| 4,065,781 A | 12/1977 | Gutknecht |
| 4,583,105 A | 4/1986 | Rosenberg |

(Continued)

FOREIGN PATENT DOCUMENTS

| JP | 61272974 A | 12/1986 |
| JP | 1061065 | 3/1989 |

OTHER PUBLICATIONS

Niiyama et al.; High-Power Operation of Normally-Off GaN MOSFETs, Dec. 31, 2009; www.furukawa.com.jp/review/fr036/fr36_01.pdf.

(Continued)

*Primary Examiner* — Dale E Page
(74) *Attorney, Agent, or Firm* — William Greener; Alek P. Szecsy; Bond, Schoeneck & King, PLLC

(57) ABSTRACT

A gated III-V semiconductor structure and a method for fabricating the gated III-V semiconductor structure includes a threshold modifying dopant region within a III-V semiconductor barrier layer at the base of an aperture through a passivation layer that otherwise passivates the III-V semiconductor barrier layer. The passivation layer, which may comprise an aluminum-silicon nitride material, has particular bandgap and permittivity properties that provide for enhanced performance of a III-V semiconductor device that derives from the III-V semiconductor structure absent a field plate. The threshold modifying dopant region provides the possibility for forming both an enhancement mode gated III-V semiconductor structure and a depletion mode III-V semiconductor structure on the same substrate. The threshold modifying dopant region when comprising a magnesium (Mg) threshold modifying dopant may be incorporated into the gates III-V semiconductor structure using a dicyclopentadienyl magnesium (Cp2Mg) vapor diffusion method or a magnesium-silicon nitride (MgSiN) solid state diffusion method.

24 Claims, 8 Drawing Sheets

(51) Int. Cl.
*H01L 23/29* (2006.01)
*H01L 29/66* (2006.01)
*H01L 23/31* (2006.01)
*H01L 29/10* (2006.01)
*H01L 29/20* (2006.01)

(52) U.S. Cl.
CPC ...... *H01L29/66462* (2013.01); *H01L 29/7786* (2013.01); *H01L 21/02381* (2013.01); *H01L 23/3171* (2013.01); *H01L 29/1066* (2013.01); *H01L 29/2003* (2013.01); *H01L 2924/0002* (2013.01)

(56) References Cited

U.S. PATENT DOCUMENTS

| | | | |
|---|---|---|---|
| 4,788,156 | A | 11/1988 | Stoneham et al. |
| 4,866,491 | A | 9/1989 | Solomon et al. |
| 5,559,368 | A | 9/1996 | Hu et al. |
| 5,776,813 | A | 7/1998 | Huang et al. |
| 5,866,925 | A | 2/1999 | Zolper et al. |
| 5,937,303 | A | 8/1999 | Gardner et al. |
| 6,083,781 | A | 7/2000 | Zolper et al. |
| 6,593,194 | B2 | 7/2003 | Kolodzey et al. |
| 6,914,273 | B2 | 7/2005 | Ren et al. |
| 7,105,868 | B2 | 9/2006 | Nause et al. |
| 7,485,512 | B2 | 2/2009 | Harris et al. |
| 7,901,994 | B2 | 3/2011 | Saxler et al. |
| 2001/0015437 | A1 | 8/2001 | Ishii et al. |
| 2007/0164315 | A1* | 7/2007 | Smith .................. H01L 21/318 257/194 |
| 2009/0045438 | A1* | 2/2009 | Inoue .................. H01L 29/155 257/192 |
| 2009/0146185 | A1* | 6/2009 | Suh .................. H01L 29/2003 257/194 |
| 2010/0025730 | A1* | 2/2010 | Heikman .......... H01L 29/7787 257/194 |
| 2010/0258841 | A1 | 10/2010 | Lidow et al. |
| 2010/0258842 | A1 | 10/2010 | Lidow et al. |
| 2010/0258843 | A1 | 10/2010 | Lidow et al. |
| 2010/0258912 | A1 | 10/2010 | Beach et al. |

OTHER PUBLICATIONS

Hongwei Chen; Enhancement-mode AlGaN/GaN HEMTs Fabricated by Standard Fluorine ion Implantation; Hong Kong University of Science and Technology; May 17, 2010; www.csmantech.org/Digests/2010/Papers/09.3.045.pdf.

Lee, Sang Ho; International Search Report and Written Opinion of the International Searching Authority; Jan. 16, 2012.

* cited by examiner $$\sigma_\eta = \frac{\sigma_{p1} - \sigma_{p2} - C_B \psi - C_2 \phi + \frac{C_B}{C_{in}}(\sigma_T - \sigma_{p1}) - C_B \left(\frac{qN_{in}}{2\varepsilon_{in}} t_{in}^2\right)}{1 + C_B \frac{t_{in}^2}{q^2 m^*}} \quad (1)$$

WHERE $\psi = \phi_B - \Delta E_C - \Delta E_C^{in}$ $$C_{in} = \frac{\varepsilon_{in}}{t_{in}}$$

$$C_2 = \frac{\varepsilon_{GaN}}{t_{GaN}}$$

$$C_B = \left(\frac{1}{C_{in}} + \frac{t_{AlGaN}}{\varepsilon_{AlGaN}}\right)^{-1}$$

FIG. 2A

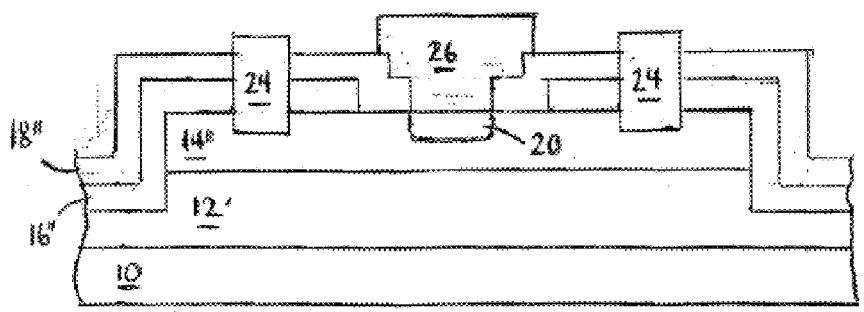
FIG. 4K
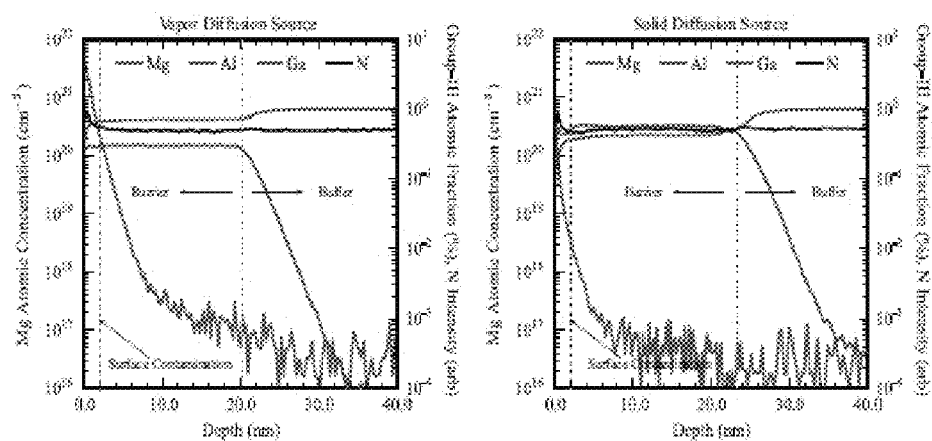
FIG. 5A
FIG. 5B $$\Delta V_{th} = \Delta V_{FB} = -\frac{1}{C_{AlGaN}} \int_0^{x_d} \frac{x\rho(x)}{\varepsilon_{AlGaN}} dx = +\frac{qn_{Mg}x_d^2}{2\varepsilon_{AlGaN}}$$
$$= +\frac{1.602(10^{-19})10^{20}[3.5(10^{-7})]^2}{2(9.4)8.854(10^{-14})}$$
$$= 1.18\ V$$

GATED III-V SEMICONDUCTOR STRUCTURE AND METHOD

CROSS-REFERENCE TO RELATED APPLICATION

This application is related to, and derives priority from, U.S. Provisional Patent Application Ser. No. 61/357,641, filed 23 Jun. 2010, and titled "AlGaN/GaN Device and Method" the content of which is incorporated herein fully by reference.

STATEMENT OF GOVERNMENT INTEREST

This invention was funded under an Office of Naval Research grant number N-00014-03-1-0963. The U.S. Government has rights in this invention.

BACKGROUND

1. Field of the Invention

Embodiments relate generally to III-V based gated semiconductor structures and gated semiconductor devices. More particularly, embodiments relate to enhanced performance within III-V based gated semiconductor structures and gated semiconductor devices.

2. Description of the Related Art

III-V based semiconductor structures and semiconductor devices often provide superior performance in certain applications in comparison with silicon based semiconductor structures and semiconductor devices. For example, gallium arsenide III-V based semiconductor structures and semiconductor devices are particularly common within microwave applications.

In addition, group III nitride based semiconductor structures and semiconductor devices, and in particular group III nitride transistors, are desirable for high power electrical circuit applications since group III nitride transistors are capable of carrying large currents (i.e., greater than about 1.5 amps/mm normalized to gate periphery) at high operating electric field strengths (i.e., greater than several megavolts/cm).

Group III nitride transistors comprise as an active semiconductor material at least one group III elemental nitride. Since the common group III elemental nitrides include aluminum, indium and gallium nitrides, several binary, ternary and quaternary compositions exist for group III nitride transistors.

Commonly, a group III nitride transistor comprises a substrate over which is successively layered at least two group III nitride material layers having different bandgap characteristics. A buffer layer is located closer to the substrate and a barrier layer is located upon the buffer layer and generally has a wider bandgap. Due to the difference in bandgaps a 2 dimensional electron gas (2DEG) is induced at the interface of the buffer layer and the barrier layer. The two dimensional electron gas (2DEG) typically is highly localized near the heterojunction interface, but largely within the buffer layer that has a narrower bandgap.

While III-V semiconductor structures, including group III nitride transistors, provide many performance advantages, III-V semiconductor structures are nonetheless not entirely without problems. In that regard, III-V semiconductor structures, like many other semiconductor structures and related semiconductor devices, are subject to improvement in operating capabilities and performance.

Since III-V semiconductor structures are likely to remain popular within several applications where the enhanced operating characteristics of III-V semiconductor devices that derive from operation of the III-V semiconductor structures are primary considerations, desirable are additional III-V semiconductor structures and methods for fabricating the additional III-V semiconductor structures, with enhanced operating capabilities and performance.

SUMMARY

Embodiments include gated III-V semiconductor structures and methods for fabricating the gated III-V semiconductor structures. Each of the foregoing gated III-V semiconductor structures and related methods utilizes: (1) a threshold modifying dopant region included within a barrier layer beneath a gate within a gated III-V semiconductor structure; and (2) an aluminum-silicon nitride (AlSiN) passivation layer (or other material layer having equivalent bandgap and permittivity physical properties) passivating at least a portion of the barrier layer (and preferably a portion of the barrier layer adjoining the threshold modifying dopant region).

More particularly, the embodiments are directed towards a gated III-V semiconductor structure that includes: (1) a gallium nitride (GaN) buffer layer and aluminum-gallium nitride (AlGaN) barrier layer that includes the threshold modifying dopant region; and (2) an aluminum-silicon nitride (AlSiN) passivation layer passivating at least the portion of the barrier layer (and preferably a portion of the barrier layer adjoining the threshold modifying dopant region).

Within the context of additional disclosure below, the embodiments also include: (1) a vapor phase diffusion method for forming the threshold modifying dopant region within the barrier layer beneath the gate within the gated III-V semiconductor structure; as well as (2) a solid state diffusion method for forming the threshold modifying dopant region within the barrier layer beneath the gate within the gated III-V semiconductor structure. By including such a threshold modifying dopant region, a gated III-V semiconductor structure, such as but not limited to a group III nitride high electron mobility transistor (HEMT) semiconductor structure, may be fabricated with both enhancement mode semiconductor devices and depletion mode semiconductor devices upon a single monolithic substrate, thus providing a complementary high electron mobility transistor (HEMT) structure within and upon the single monolithic substrate.

With respect to the aluminum-silicon nitride (AlSiN) passivation layer that passivates the barrier layer within the gated III-V semiconductor structure preferably adjoining the threshold modifying dopant region, by locating and forming the aluminum-silicon nitride (AlSiN) passivation layer upon at least the portion of the barrier layer within the gated III-V semiconductor structure preferably adjoining the threshold modifying dopant region, improved operating characteristics are realized within a gated III-V semiconductor device that comprises the aluminum-silicon nitride (AlSiN) passivation layer, in comparison with a gated III-V semiconductor structure that includes a silicon nitride (SiN) passivation layer in the alternative of the aluminum-silicon nitride (AlSiN) passivation layer. Notably, such improved operating characteristics allow for avoidance of use of a field plate within a III-V semiconductor structure, such as but not limited to a group III nitride high electron mobility transistor (HEMT) semiconductor structure in accordance with the embodiments.

While not necessarily being bound by any theory of operation of the embodiments, it is believed that the presence of the aluminum-silicon nitride (AlSiN) passivation layer, rather than the silicon nitride (SiN) passivation layer, provides for superior passivation of the III-V semiconductor barrier layer surface due to a higher bandgap and a lower permittivity of aluminum-silicon nitride (AlSiN) in comparison with silicon nitride (SiN).

In that regard, FIG. 1 shows an energy band diagram for an aluminum-silicon nitride (i.e., specifically $AlN_xSiN_y$, or generally AlSiN) passivation layer deposited on an aluminum-gallium nitride/gallium nitride (i.e., AlGaN/GaN) high electron mobility transistor (HEMT) structure (Ga face) in accordance with the embodiments.

To be consistent with experimental observations a fixed volumetric negative charge is introduced (denoted as $N_{in}$) within the aluminum-silicon nitride (AlSiN) passivation layer in addition to a fixed positive interface charge $\sigma_T$. For low pressure chemical vapor deposition (LPCVD) deposited silicon nitride (SiN) layers, the interface charge is equal and opposite to the polarization charge present on the aluminum-gallium nitride (AlGaN) surface ($\sigma_{p1}$) which effectively eliminates the surface depletion of channel electron charge ($\sigma_n$) for reasonably thick dielectric passivation layers (typically greater than 250 angstroms). For aluminum-silicon nitride (AlSiN) passivation layers the fixed positive interface charge is reduced by as much as 50%, and additional negative charge is within the passivation layer, both of which reestablish the surface depletion with the aluminum-silicon nitride (AlSiN) passivation layer located and formed upon the aluminum-gallium nitride (AlGaN) barrier layer surface (as opposed to a silicon nitride (SiN) passivation layer passivated high electron mobility transistor (HEMT) structure) thereby reducing the channel charge in regions under the aluminum-silicon nitride (AlSiN) passivation layer.

Using the energy bandgap diagram as illustrated in FIG. 1, and simple quantum mechanics and electrostatics, the equations of FIG. 2A may be used to predict the electron sheet charge present at the aluminum-gallium nitride/gallium nitride (AlGaN/GaN) heterojunction with an aluminum-silicon nitride (AlSiN) passivation layer present.

Within the equations of FIG. 2A, $\in_{in}$, $\in_{GaN}$, and $\in_{AlGaN}$ are the permittivities of the aluminum-silicon nitride (AlSiN) passivation layer, the gallium nitride (GaN) buffer layer and the aluminum-gallium nitride (AlGaN) barrier layer, respectively. The thickness of the aluminum-silicon nitride (AlSiN) passivation layer, the gallium nitride (GaN) buffer layer, and the aluminum-gallium nitride (AlGaN) barrier layer are given as $t_{in}$, $t_{GaN}$, and $t_{AlGaN}$, respectively. The potential $\phi B$ is the surface barrier height, and the potentials $\Delta E_c$ and $\Delta E_c^{in}$ are the conduction band offsets for the gallium nitride/aluminum-gallium nitride (GaN/AlGaN) interface and the aluminum-gallium nitride/aluminum-silicon nitride (AlGaN/AlSiN) interface respectively.

The aluminum nitride (AlN) molar fraction in the passivation layer determines how much distributed negative charge and fixed positive charge is introduced. Controlling the composition of the aluminum-silicon nitride (AlSiN) passivation layer and its thickness allows for the engineering of the channel charge in ungated portions of the III-V semiconductor structure channel. This in turn allows a semiconductor device designer to significantly reduce the longitudinal electric field strength on both the source side and the drain side of a gate for a given set of bias conditions. The sharp reduction in these electric fields strengths can minimize or eliminate undesirable characteristics of a III-V semiconductor device including non-linear increase in a device source resistance with a drain current, and a DC to RF dispersion which reduces the PAE (i.e., power added efficiency) of the semiconductor device as the drain bias is increased.

For illustrative purposes III-V semiconductor devices that were fabricated with 10 atomic percent aluminum within an aluminum-silicon nitride (AlSiN) passivation layer had volumetric negative charge densities of roughly 1e18 per cubic centimeter and a positive interface charge density which was 90% as large as the aluminum-gallium nitride (AlGaN) passivation layer polarization surface charge density. As shown in FIG. 2B, the measured data for a silicon nitride (SiN) passivation layer is shown as the dark squares and the measured data for the aluminum-silicon nitride (AlSiN) passivation layer is shown as the open circles. The smooth curves (i.e., reference numeral 201 for the silicon nitride (SiN) passivation layer and reference numeral 202 for the aluminum-silicon nitride (AlSiN) passivation layer) are produced using equation (1) in FIG. 2A, where $\sigma_T$ and $N_{in}$ are adjusted to best fit the measured data.

A particular semiconductor structure in accordance with the embodiments includes a barrier layer comprising a first III-V semiconductor material located upon a buffer layer comprising a second III-V semiconductor material different than the first III-V semiconductor material in turn located over a substrate. This particular semiconductor structure also includes a passivation layer comprising an aluminum-silicon nitride material located upon the barrier layer and including an aperture that exposes a threshold modifying dopant region located within the barrier layer. This particular semiconductor structure also includes a gate contacting the threshold modifying dopant region located within the barrier layer.

Another particular semiconductor structure in accordance with the embodiments includes a barrier layer comprising a first III-V semiconductor material located upon a buffer layer comprising a second III-V semiconductor material different than the first III-V semiconductor material in turn located over a substrate. This particular semiconductor structure also includes a passivation layer located upon the barrier layer and including an aperture that exposes a threshold modifying dopant region located within the barrier layer. This particular semiconductor structure also includes a gate contacting the threshold modifying dopant region within the barrier layer, where at least a portion of the passivation layer located upon the barrier layer comprises a passivation material having a bandgap from about 4.5 to about 6 eV and a permittivity from about 6×10^-11 F/m to about 8×10^-11 F/m at a frequency from about 1 to about 100 GHz.

Another particular semiconductor structure in accordance with the embodiments includes a barrier layer comprising a first III-V semiconductor material located upon a buffer layer comprising a second III-V semiconductor material different than the first III-V semiconductor material in turn located over a substrate. This particular semiconductor structure also includes a passivation layer located upon the barrier layer and including an aperture that exposes symmetrically aligned with the aperture a threshold modifying dopant region within the barrier layer. This particular semiconductor structure also includes a source contact and a drain contact separated by the aperture and penetrating through the passivation layer and contacting the barrier layer but not the threshold modifying dopant region within the barrier layer. This particular semiconductor structure also includes a gate located in the aperture and contacting the threshold modifying dopant region within the barrier layer, where at least a portion of the passivation layer located upon the barrier layer comprises a passivation material having a bandgap from about 4.5 to about 6 eV and a permittivity from about 6×10^-11 F/m to about 8×10^-11 F/m at a frequency from about 1 to about 100 GHz.

A particular method for fabricating a semiconductor structure in accordance with the embodiments includes forming a layered structure comprising: (1) a buffer layer comprising a first III-V semiconductor material formed over a substrate; (2) a barrier layer comprising a second III-V semiconductor material different from the first III-V semiconductor material formed upon the buffer layer; and (3) a passivation layer comprising an aluminum-silicon nitride passivation material formed upon the barrier layer. This particular method also includes patterning a portion of the passivation located upon the barrier layer to provide an aperture that exposes a portion of the barrier layer. This particular method also includes forming a threshold modifying dopant region into the barrier layer at the base of the aperture. This particular method also includes forming a gate contacting the threshold modifying dopant region.

Another particular method for fabricating a semiconductor structure in accordance with the embodiments includes forming a layered structure comprising: (1) a buffer layer comprising a first III-V semiconductor material formed over a substrate; (2) a barrier layer comprising a second III-V semiconductor material different from the first III-V semiconductor material formed upon the buffer layer; and (3) a passivation layer comprising a passivation material having a bandgap from about 4.5 to about 6 eV and a permittivity from about $6\times10^{-11}$ F/m to about $8\times10^{-11}$ F/m at a frequency from about 1 to about 100 GHz upon the barrier layer. This particular method also includes patterning a portion of the passivation located upon the barrier layer to provide an aperture that exposes a portion of the barrier layer. This particular method also includes forming a threshold modifying dopant region into the barrier layer at the base of the aperture. This particular method also includes forming a gate contacting the threshold modifying dopant region.

BRIEF DESCRIPTION OF THE DRAWINGS

The objects, features and advantages of the embodiments are understood within the context of the Detailed Description of the Embodiments, as set forth below. The Detailed Description of the Embodiments is understood within the context of the accompanying drawings, that form a material part of this disclosure, wherein:

FIG. 2A shows a series of equations that may be used for determining interfacial electron sheet charge characteristics for the aluminum-silicon nitride (AlSiN) passivation layer passivated aluminum-gallium nitride/gallium nitride (AlGaN/GaN) group III nitride semiconductor structure in accordance with the embodiments.

FIG. 4A to FIG. 4K show a series of schematic cross-sectional diagrams illustrating the results of progressive stages in fabricating the gated III-V semiconductor structure comprising the group III nitride high electron mobility transistor (HEMT) semiconductor structure in accordance with the embodiments as illustrated in FIG. 3.

FIG. 5A and FIG. 5B shows a pair of secondary ion mass spectroscopy (SIMS) spectra illustrating elemental concentration profiles for threshold modifying dopant region incorporation within a gated III-V semiconductor structure in accordance with the embodiments.

DETAILED DESCRIPTION OF THE EMBODIMENTS

Figure 1:
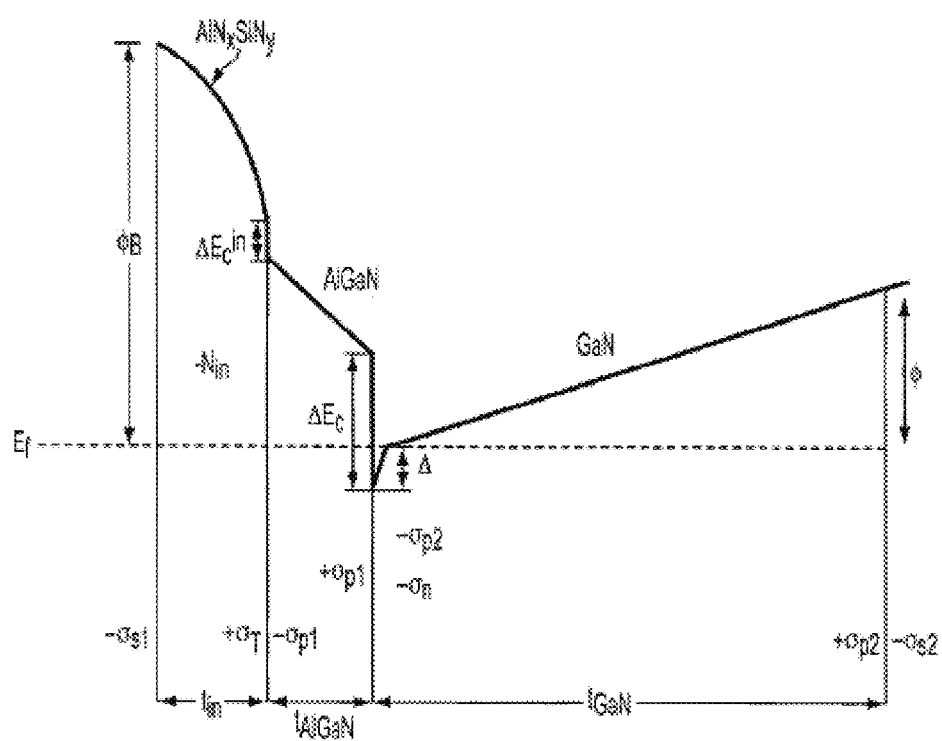
FIG. 1 shows an energy bandgap diagram for an aluminum-silicon nitride (AlSiN) layer passivated aluminum-gallium nitride/gallium nitride (AlGaN/GaN) group III nitride semiconductor structure in accordance with the embodiments.
Figure 2B:
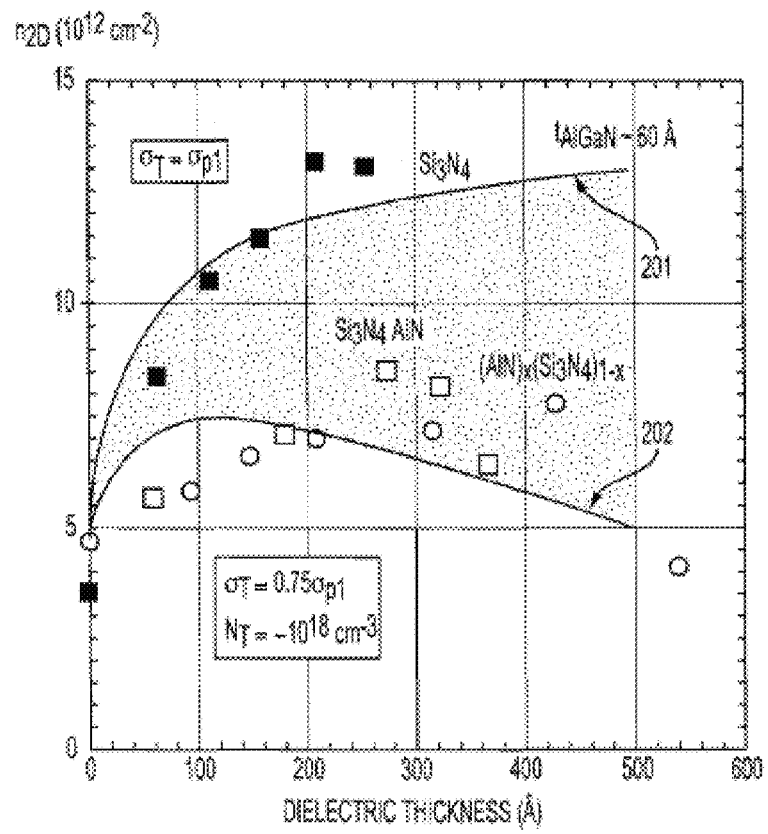
FIG. 2B shows a charge density diagram illustrating interfacial electron sheet charge characteristics for the aluminum-silicon nitride (AlSiN) passivation layer passivated aluminum-gallium nitride/gallium nitride (AlGaN/GaN) group III nitride semiconductor structure in accordance with the embodiments.

The embodiments, which include a plurality of gated III-V semiconductor structures and a related plurality of methods for fabricating the plurality of gated III-V semiconductor structures, are understood within the context of the description set forth below. The description set forth below is understood within the context of the drawings described above. Since the drawings are intended for illustrative purposes, at least some of the drawings are not necessarily drawn to scale.

While the embodiments illustrate the invention within the context of a group III nitride high electron mobility transistor (HEMT) III-V semiconductor structure and a method for fabricating the group III nitride high electron mobility transistor (HEMT) III-V semiconductor structure, the embodiments are not necessarily intended to be so limited. Rather, in a broad application, the embodiments are understood to provide superior performance characteristics for at least gated III-V semiconductor structures and gated III-V semiconductor devices that result from operation of the gated III-V semiconductor structures insofar as an aluminum-silicon nitride passivation layer (or equivalent passivation layer having appropriate bandgap and permittivity physical properties) in accordance with the embodiments is understood to provide a controlled charge depletion of a two dimensional electron gas (2DEG) in ungated portions of a channel, in comparison with a silicon nitride passivation layer which provides no surface depletion of the two dimensional electron gas (2DEG) in the ungated portions of the channel, and thus results in a full channel charge in the ungated portions of the channel.

It is anticipated that a passivation material operative within the context of the embodiments will have: (1) a bandgap larger than silicon nitride; and (2) a permittivity lower than silicon nitride, within a particular microwave frequency range, to effect the foregoing results. Thus, the embodiments broadly consider as candidate passivation dielectric materials those having: (1) a bandgap from about 4.5 eV to about 6.0 eV, more preferably from about 4.75 eV to about 5.5 eV and most preferably from about 5 to about 5.25 eV; and (2) a permittivity from about $6\times10^{-11}$ F/M to about $8\times10^{-11}$ F/m, more preferably from about $6.25\times10^{-11}$ F/m to about $7.75\times10^{-11}$ F/m and most preferably from about $6.5\times10^{-11}$ F/m to about $7.5\times10^{-11}$ F/m, at a microwave frequency from about 1 to about 100 GHz.

III-V semiconductor layers that may be passivated with an aluminum-silicon nitride (AlSiN) (or suitable alternative which may include, but is not necessarily limited to magnesium-silicon-nitride (MgSiN)) passivation layer in accordance with the embodiments include, but are not limited to: (1) gallium nitride based semiconductor layers including but not limited to aluminum gallium nitride (AlGaN), gallium nitride (GaN), aluminum indium nitride (AlInN), and gallium indium nitride (GaInN) layers; (2) gallium arsenide based semiconductor layers including but not limited to aluminum gallium arsenide (AlGaAs), gallium arsenide (GaAs), aluminum gallium indium phosphide (AlGaInP), gallium indium phosphide (GaInP) layers; (3) indium-phosphide-based semiconductor layers including aluminum indium arsenide (AlInAs), gallium indium arsenide (GaInAs), indium phosphide (InP) layers; and (4) gallium-phosphide based semiconductor layers including but not limited to aluminum gallium phosphide (AlGaP), gallium indium phosphide (GaInP) and gallium phosphide (GaP) layers. Also considered are pseudomorphic or metamorphic III-V semiconductor compositions in accordance with the above layers.

In addition, the embodiments provide for forming complementary enhancement mode and depletion mode gated III-V semiconductor structures and related gated III-V semiconductor devices by incorporating a threshold modifying dopant region within a barrier layer beneath a gate within the gated III-V semiconductor structures and related gated III-V semiconductor devices. Such threshold modifying dopant regions may include threshold modifying dopants including but not necessarily limited to magnesium and beryllium threshold modifying dopants. The foregoing threshold modifying dopants are typically included at a concentration from about 1e18 to about 2e20 threshold modifying dopant atoms or ions per cubic centimeter to a depth from about 20 to about 500 angstroms within a threshold modifying dopant region beneath a gate within a gated III-V semiconductor structure.

Figure 3:
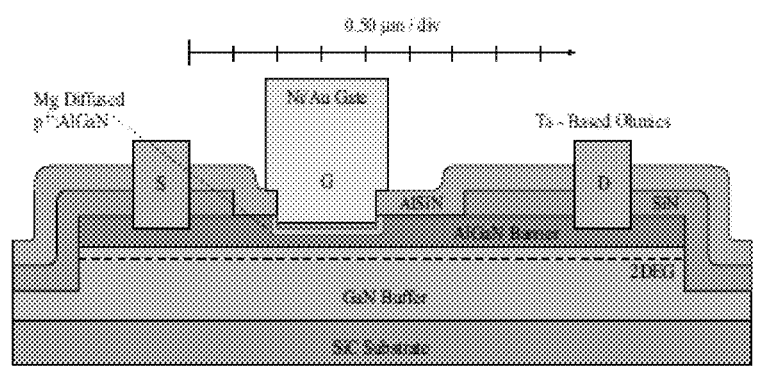
FIG. 3 shows a schematic cross-sectional diagram of a gated III-V semiconductor structure comprising a group III nitride high electron mobility transistor (HEMT) semiconductor structure in accordance with the embodiments.

FIG. 3 shows a schematic cross-sectional diagram of a III-V semiconductor structure group III nitride high electron mobility transistor (HEMT) semiconductor structure in accordance with a particular embodiment.

FIG. 3 shows a silicon carbide (SiC) substrate upon which is located and formed a gallium nitride (GaN) buffer layer. In turn, an aluminum-gallium nitride (AlGaN) barrier layer is located and formed upon the gallium nitride (GaN) buffer layer which induces a two-dimensional electron gas (2DEG) primarily within the gallium nitride (GaN) buffer layer. FIG. 3 also shows a two layer passivation layer stack passivating primarily the aluminum-gallium nitride (AlGaN) barrier layer. The two layer passivation layer stack comprises: (1) a lower lying silicon nitride (SiN) layer located and formed upon portions of the aluminum-gallium nitride (AlGaN) barrier layer and the gallium nitride (GaN) buffer layer; as well as (2) an upper lying aluminum-silicon nitride (AlSiN) layer located and formed upon further exposed portions of the silicon nitride (SiN) layer and the aluminum-gallium nitride (AlGaN) barrier layer. FIG. 3 also shows a source contact S and a drain contact D located and formed through the two layer passivation layer stack comprising the silicon nitride (SiN) layer and the aluminum-silicon nitride (AlSiN) layer to contact and embed within the aluminum-gallium nitride (AlGaN) barrier layer. FIG. 3 further also shows a gate G located and formed contacting the aluminum-gallium nitride (AlGaN) barrier layer at a location asymmetrically interposed between the source contact S (i.e., closer) and the drain contact D (i.e., further). FIG. 3 also shows a magnesium (Mg) threshold modifying dopant region within the aluminum-gallium nitride (AlGaN) barrier layer at the base of the gate G.

With respect to the two dimensional electron gas (2DEG) region located and formed at the interface of the gallium nitride (GaN) buffer layer and the aluminum-gallium nitride (AlGaN) barrier layer, the two dimensional electron gas (2DEG) is a result of a difference in bandgap between the gallium nitride (GaN) buffer layer and the aluminum-gallium nitride (AlGaN) barrier layer. The two dimensional electron gas (2DEG) is integral to operation of the group III nitride high electron mobility transistor (HEMT) semiconductor structure whose schematic cross-sectional diagram is illustrated in FIG. 3.

Within the context of the embodiments, the presence of the magnesium (Mg) threshold modifying dopant region at the base of the gate G within the aluminum-gallium nitride (AlGaN) barrier layer is intended as a threshold modifying dopant region that allows for fabrication of an enhancement mode III-V semiconductor structure high electron mobility transistor (HEMT) semiconductor structure in comparison with and in conjunction with a depletion mode III-V semiconductor structure high electron mobility transistor (HEMT) semiconductor structure that may be otherwise fabricated absent the magnesium (Mg) threshold modifying dopant region. Thus, the magnesium (Mg) (or alternative, such as but not limited to beryllium) threshold modifying dopant region allows for fabrication of complementary enhancement mode and depletion mode III-V high electron mobility transistor (HEMT) semiconductor structures located and formed upon a single silicon carbide (or alternative) substrate, thus further providing enhanced functionality III-V high electron mobility transistor (HEMT) semiconductor structures upon the single silicon carbide (or alternative) substrate.

As is discussed above, integral to the embodiments is the presence of the aluminum-silicon nitride (AlSiN) passivation layer (or alternative passivation layer having equivalent bandgap and permittivity physical properties as disclosed above) located and formed passivating the aluminum-gallium nitride (AlGaN) barrier layer adjoining the gate G and the magnesium (Mg) (or alternative) threshold modifying dopant region. Thus, while the schematic cross-sectional diagram of FIG. 3 shows an enhancement mode III-V semiconductor structure group III nitride high electron mobility transistor (HEMT) semiconductor structure in accordance with the embodiments, such a III-V semiconductor structure group III nitride high electron mobility transistor (HEMT) semiconductor structure in accordance with FIG. 3 is illustrative of the embodiments rather than limiting of the embodiments. For example and without further limitation, the silicon nitride (SiN) passivation layer as is illustrated in FIG. 3 may be omitted entirely within the III-V semiconductor structure group III nitride high electron mobility transistor (HEMT) semiconductor structure whose schematic cross-sectional diagram is illustrated in FIG. 3 leaving only the aluminum-silicon nitride (AlSiN) layer passivating the aluminum-gallium nitride (AlGaN) barrier layer interposed between the source S contact and the drain D contact. As well, the embodiments also contemplate that the gate G may be somewhat recessed within the aluminum-gallium nitride (AlGaN) barrier layer similarly with the source S contact and the drain D contact, and include a gate dielectric interposed between the gate G and the aluminum-gallium nitride (AlGaN) barrier layer that includes the magnesium (Mg) threshold modifying dopant region.

FIG. 4A to FIG. 4H show a series of schematic cross-sectional diagrams illustrating the results of progressive process stages in fabricating an enhancement mode group III nitride high electron mobility transistor (HEMT) III-V semiconductor structure in accordance with the embodiments and further in accordance with the schematic cross-sectional diagram of FIG. 3.

Figure 4A:
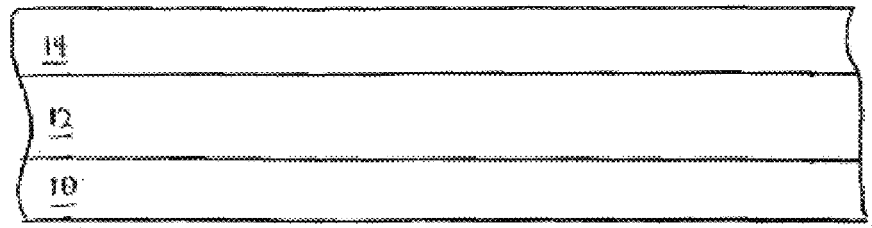

FIG. 4A shows a substrate 10 upon which is located and formed a buffer layer 12 (i.e., illustrated within FIG. 3 as gallium nitride (GaN) buffer layer, but not intended to be so limited). A barrier layer 14 is located and formed upon the buffer layer 12 (i.e., illustrated within FIG. 3 as an aluminum-gallium nitride (AlGaN) buffer layer, but also not intended to be so limited).

Each of the layers that comprise the group III nitride high electron mobility transistor (HEMT) III-V semiconductor structure whose schematic cross-sectional diagram is illustrated in FIG. 4A may comprise materials and have dimensions that are otherwise generally conventional in the III-V semiconductor structure design and fabrication art, and more particularly the group III nitride high electron mobility transistor (HEMT) design and fabrication art.

For example, the substrate 10 may comprise any of several substrate materials that are generally conventional in the III-V semiconductor structure or group III nitride high electron mobility transistor (HEMT) semiconductor structure design and fabrication art. Such substrate materials may include, but are not necessarily limited to silicon (Si), silicon carbide (SiC), sapphire (Al2O3), gallium nitride (GaN), aluminum nitride (AlN), germanium (Ge), gallium arsenide (GaAs), gallium phosphide (GaP) and indium phosphide (InP) substrate materials. Alternatively, any single crystal semiconductor host substrate may also be used for the substrate 10.

An insulating buffer layer located and formed on the substrate 10 may also be included as a surface portion of the substrate 10. This insulating buffer layer may include a thin wide bandgap substrate isolation material (i.e., AlN for GaN based semiconductor devices and AlGaInP for GaAs based semiconductor devices, as non-limiting examples).

Within the context particularly of a group III nitride high electron mobility transistor (HEMT) III-V semiconductor structure, each of the buffer layer 12 and the barrier layer 14 comprises a group III nitride semiconductor material, albeit with a different bandgap. Generally, a bandgap of the buffer layer 12 is lower than a bandgap of the barrier layer 14. Thus, several choices and selections exist for a group III nitride semiconductor material for the buffer layer 12 and for the barrier layer 14. Commonly, the buffer layer 12 comprises a gallium nitride (GaN) group III nitride semiconductor material that has a thickness from about 100 to about 3000 nanometers and the barrier layer 14 comprises an aluminum-gallium nitride (AlGaN) group III nitride semiconductor material that has a thickness from about 1 to about 100 nanometers.

Figure 4B:
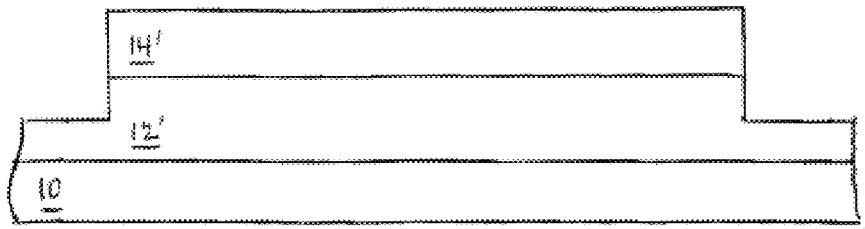

FIG. 4B shows the results of sequentially etching the barrier layer 14 and the buffer layer 12 to form a barrier layer 14' and a buffer layer 12'. Such etching of the barrier layer 14 and the buffer layer 12 to provide the barrier layer 14' and the buffer layer 12' may be effected using photolithographic and etch methods that are otherwise generally conventional in the semiconductor fabrication art. Such photolithographic and etch methods may include, but are not necessarily limited to electron beam photolithographic methods and reactive ion etch methods. As is illustrated in the schematic cross-sectional diagram of FIG. 4B, etching of the barrier layer 14 and the buffer layer 12 provides a mesa of the barrier layer 14' and an upper portion of the buffer layer 12' with respect to a lower portion of the buffer layer 12'.

Figure 4C:
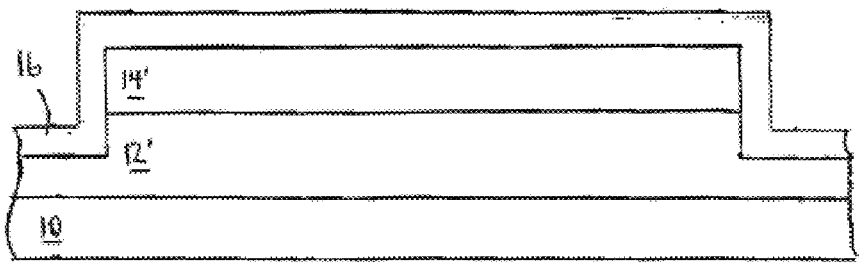

FIG. 4C shows a first passivation layer 16 located and formed upon exposed portions of the barrier layer 14' and the buffer layer 12' that are illustrated in FIG. 4B. As is understood within the context of FIG. 3, and including further description above, the first passivation layer 16 is optional within the context of the embodiments, but when present typically comprises a silicon nitride (SiN) material that may be otherwise generally conventional in the semiconductor fabrication art.

Figure 4D:
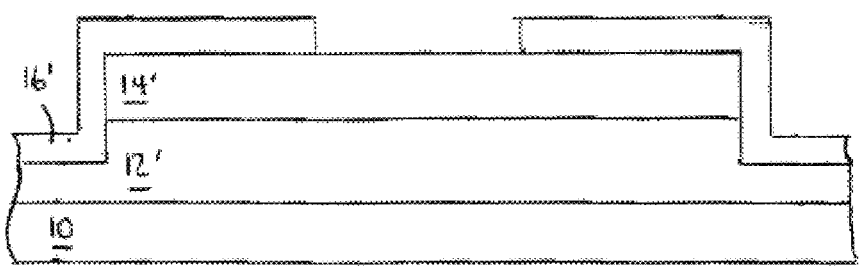

FIG. 4D shows the results of patterning the first passivation layer 16 to provide a first passivation layer 16' that leaves exposed a portion of the barrier layer 14'. The first passivation layer 16 may be patterned to provide the first passivation layer 16' while using methods and materials that are otherwise generally conventional in the semiconductor fabrication art. Such methods and materials may include, but are not necessarily limited to photolithographic and etch methods and materials.

Figure 4E:
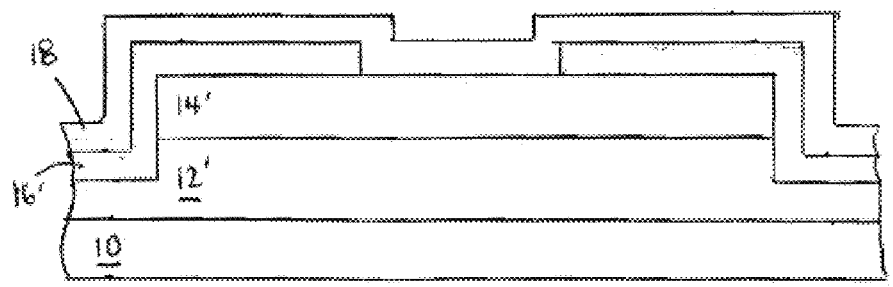

FIG. 4E shows the results of locating and forming a second passivation layer 18 upon the semiconductor structure of FIG. 4D, including in particular the barrier layer 14' and the first passivation layer 16'. Within the embodiments, the second passivation layer 18 comprises an aluminum-silicon nitride (AlSiN) material, or alternatively a second passivation material that possesses the bandgap and the permittivity characteristics as described above within the context of alternatives for the aluminum-silicon nitride (AlSiN) passivation material.

As is discussed further above, the instant embodiment derives in-part from an influence that the second passivation layer 18 has with respect to operation of the group III nitride high electron mobility transistor (HEMT) semiconductor structure of FIG. 3, or alternative gated III-V semiconductor structures that are within the context of the embodiments. Thus, the second passivation layer 18 comprises an aluminum-silicon nitride (AlSiN) passivation material (or a suitable alternative passivation material) that has: (1) a bandgap from about 4.5 to about 6 eV, more preferably from about 4.75 eV to about 5.5 eV and most preferably from about 5 to about 5.25 eV; and (2) a permittivity from about $6 \times 10^{-11}$ F/m to about $8 \times 10^{-11}$ F/m, more preferably from about $6.25 \times 10^{-11}$ F/m to about $7.75 \times 10^{-11}$ F/m and most preferably from about $6.5 \times 10^{-11}$ F/m to about $7.5 \times 10^{-11}$ F/m, at a microwave frequency from about 1 to about 100 GHz.

When the second passivation layer comprises an aluminum-silicon nitride (AlSiN) material, the aluminum-silicon nitride (AlSiN) material has an aluminum content from about 0.1 to about 25 atomic percent, a silicon content from about 25 to about 55 atomic percent and a nitrogen content from about 40 to about 60 atomic percent.

The aluminum-silicon nitride (AlSiN) material used for forming the second passivation layer 18 may be deposited using a low pressure chemical vapor deposition (LPCVD) method using dichlorosilane, ammonia and trimethylaluminum as a silicon precursor, a nitrogen precursor and an aluminum precursor. Typical deposition conditions include: (1) a reactor chamber pressure from about 1 to about 3 torr; (2) a substrate temperature from about 500 to about 800 degrees centigrade; (3) a dichlorosilane silicon precursor flow from about 50 to about 200 standard cubic centimeters per minute in a nitrogen carrier gas flow from about 500 to about 20000 standard cubic centimeters per minute; (4) an ammonia nitrogen precursor flow from about 50 to about 2000 standard cubic centimeters per minute in a nitrogen carrier gas flow from about 500 to about 20000 standard cubic centimeters per minute; and (5) a trimethylaluminum aluminum precursor flow from about 1 to about 500 standard cubic centimeters per minute in a nitrogen carrier gas flow from about 10 to about 5000 standard cubic centimeters per minute.

Typically, the second passivation layer 18 when formed of an aluminum-silicon nitride (AlSiN) material has a thickness from about 2 to about 5000 nanometers.

Figure 4F:
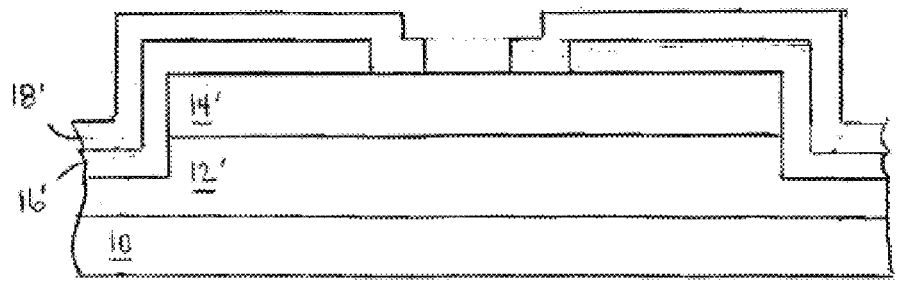

FIG. 4F shows the results of patterning the second passivation layer 18 to provide a second passivation layer 18' that exposes a portion of the barrier layer 14'. The second passivation layer 18 may be patterned to provide the second passivation layer 18' that exposes a portion of the barrier layer 14' while using methods and materials analogous, equivalent or identical to the methods and materials used for forming the first passivation layer 16' from the first passivation layer 16.

Figure 4G:
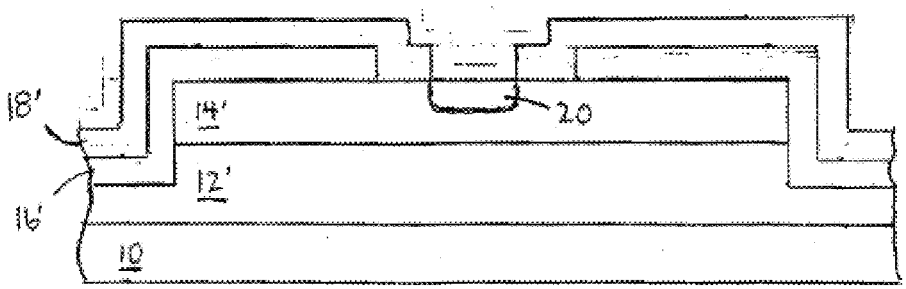

FIG. 4G shows a threshold modifying dopant region 20 located and formed into the barrier layer 14' at the base of an aperture defined by the second passivation layer 18'. Thus, the threshold modifying dopant region 20 adjoins the second passivation layer 18'. As is understood by a person skilled in the art, and as is discussed further above, the threshold modifying dopant region 20 provides for the possibility of forming complementary enhancement mode and depletion mode group III nitride high electron mobility transistor (HEMT) semiconductor structures upon a single substrate 10. Moreover, as will be apparent from further discussion below, the threshold modifying dopant region 20 is formed symmetrically with respect to the aperture defined by the second passivation layer 18'.

Within the schematic cross-sectional diagram of FIG. 4G, the threshold modifying dopant region 20 when comprising a magnesium (Mg) threshold modifying dopant may in a first instance be formed using a thermal diffusion method that uses a dicyclopentadienyl magnesium (Cp2Mg) vapor diffusion source and vapor diffusion method, as is discussed below in greater detail below within the Experimental section. Other magnesium threshold modifying dopants may be used. The embodiments also contemplate that other than magnesium threshold modifying dopants may be used to provide the threshold modifying dopant region 20. As discussed above within the context of FIG. 3, such other threshold modifying dopants may include, but are not necessarily limited to beryllium threshold modifying dopants.

When using a dicyclopentadienyl magnesium (Cp2Mg) vapor diffusion source (bubbler temperature about 40 to about 50 degrees centigrade and bubbler pressure from about 60 to about 100 torr) at a flow rate of about 90 to about 100 standard cubic centimeters per minute in conjunction with an ammonia (NH3) source at a flow rate of about 30 to about 40 standard cubic centimeters per minute in an aggregate nitrogen (N2) carrier gas at a flow rate of about 2000 to about 2500 standard cubic centimeters per minute and a reaction temperature of about 950 to about 1000 degrees centigrade and a reaction pressure from about 1.5 to about 2.5 torr in a vapor diffusion method for forming the threshold modifying dopant region 20, a magnesium nitride (MgN) residue layer is often formed upon the high electron mobility transistor (HEMT) semiconductor structure of FIG. 4G. Such a magnesium nitride (MgN) residue layer may be removed using an aqueous hydrochloric acid etchant at an elevated temperature for an appropriate time period.

In addition to the threshold modifying dopant region 20 formation methodology using a vapor deposition source as illustrated in FIG. 4G, the embodiments also contemplate an additional method for introducing the threshold modifying dopant region 20 into the barrier layer 14' at the base of an aperture through the second passivation layer 18' to provide the threshold modifying dopant region 20 within the barrier layer 14'. The specifics of this particular additional method for forming the threshold modifying dopant region 20 are illustrated in FIG. 4H and FIG. 4I.

Figure 4H:
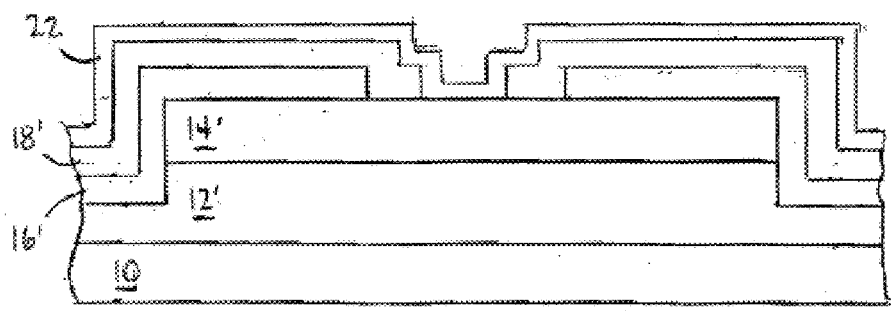

FIG. 4H shows a dopant effusing layer 22 located and formed upon the high electron mobility transistor structure of FIG. 4F. For example and without limitation, when a desired threshold modifying dopant region 20 comprises a magnesium (Mg) dopant, the dopant effusing layer 22 may comprise a magnesium-silicon nitride (MgSiN) material. Typically and preferably the magnesium-silicon nitride (MgSiN) material dopant effusing layer 22 is located and formed upon the high electron mobility transistor (HEMT) semiconductor structure of FIG. 4F while using a chemical vapor deposition (CVD) method, to provide the dopant effusing layer 22 of composition about 3 to about 5 atomic percent magnesium (Mg).

General conditions for forming the dopant effusing layer 22 comprising the magnesium-silicon-nitride (MgSiN) material include: (1) an ammonia source gas flow of about 250 to about 300 standard cubic centimeters per minute in a nitrogen carrier gas flow of about 1200 to about 2000 standard cubic centimeters per minute; (2) a generally low silane source gas flow of about 30 to about 50 standard cubic centimeters per minute in a nitrogen carrier gas flow of about 1200 to about 2000 standard cubic centimeters per minute; (3) a Cp2Mg source gas flow of about 90 to about 100 standard cubic centimeters per minute in a nitrogen carrier gas flow of 650 to about 850 standard cubic centimeters per minute; (4) a reactor chamber pressure of about 1.5 to about 2.5 torr; and (5) a reactor chamber temperature of about 600 to about 800 degrees centigrade.

Figure 4I:
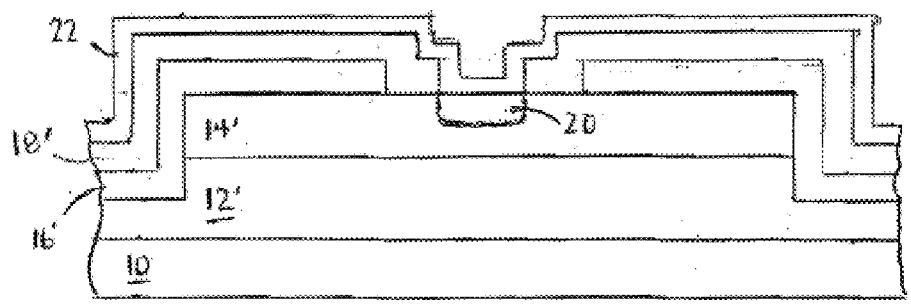

FIG. 4I shows the results of thermally annealing the group III-nitride high electron mobility transistor (HEMT) III-V semiconductor structure of FIG. 4H to also provide the threshold modifying dopant region 20 located and formed in the barrier layer 14'. Typically and preferably, the thermal annealing is undertaken at a temperature greater than about 1000 degrees centigrade using rapid thermal annealing conditions when the dopant effusing layer 22 comprises a magnesium-silicon nitride (MgSiN) material.

Figure 4J:
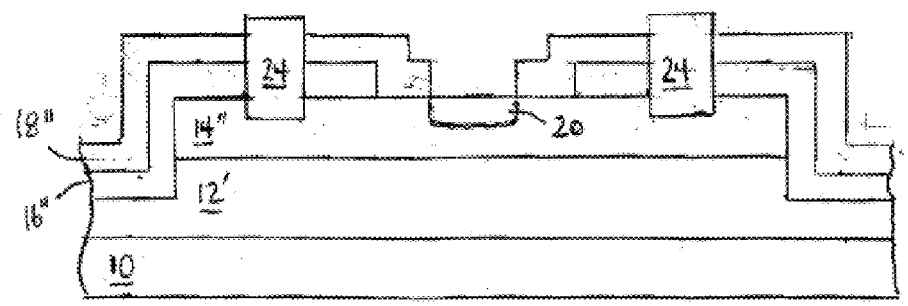

FIG. 4J first shows the results of stripping the dopant effusing layer 22 from the high electron mobility transistor (HEMT) semiconductor structure of FIG. 4I. The dopant effusing layer 22 may be stripped from the high electron mobility transistor (HEMT) semiconductor structure of FIG. 4I to provide the high electron mobility transistor (HEMT) semiconductor structure of FIG. 4J while using stripping methods and materials that are otherwise generally conventional in the semiconductor fabrication art. Such stripping methods and materials may include, but are not necessarily limited to wet chemical stripping methods and materials, dry plasma stripping methods and materials and combinations of wet chemical stripping methods and materials and dry plasma stripping methods and materials.

FIG. 4J also shows a plurality of source and drain contacts 24 located and formed through a second passivation layer 18" derived from the second passivation layer 18' and a first passivation layer 16" derived from the first passivation layer 16', and as well partially embedded within separated portions of a barrier layer 14" derived from the barrier layer 14'. The source and drain contacts 24 may be formed using methods and materials that are otherwise generally conventional in the semiconductor fabrication art.

FIG. 4K finally shows a gate 26 located and formed laterally abutted by and contacting the second passivation layer 18" and horizontally contacting the threshold modifying dopant region 20 within the barrier layer 14". The gate 26 may also be formed using methods and materials that are otherwise generally conventional in the semiconductor fabrication art.

More particularly, the source and drain contacts 24 desirably provide ohmic contact to at least the barrier layer 14", and as a result of that consideration the source and drain contacts 24 typically comprise a metal material or a stack of metal materials. Typically and preferably, each of the source and drain contacts 24 comprises a metallization stack that includes in a layered succession tantalum, titanium, aluminum, molybdenum and gold. The metallization stack has a thickness that allows for an elevation above second passivation layer 18″ which is desirably formed of an aluminum-silicon nitride (AlSiN) material.

Analogously with the source and drain contacts 24, the gate 26 also typically comprises a metal material, or a metallization stack, but typically a different metal or metallization stack in comparison with the source and drain contacts 24. While by no means limiting the embodiments, the gate 26 may comprise a successively layered metallization stack including a nickel material upon which is located and formed a gold material.

As is understood by a person skilled in the art, alternative process sequences in comparison with the process sequence of FIG. 4A to FIG. 4K are not precluded for fabricating a group III nitride high electron mobility transistor (HEMT) semiconductor structure in accordance with the embodiments as illustrated in FIG. 3A. In particular, alternative methods for forming the threshold modifying dopant region 20 are also contemplated. Such alternative methods may include, but are not necessarily limited to, ion implantation methods.

Experimental

Gallium nitride (GaN) buffer layer and aluminum-gallium nitride (AlGaN) barrier layer group III nitride high electron mobility transistor (HEMT) semiconductor structures with a magnesium (Mg) threshold modifying dopant region in accordance with the embodiments discussed above were fabricated using both of: (1) a dicyclopentadienyl magnesium (Cp2Mg) vapor diffusion source; and (2) a magnesium-silicon nitride (MgSiN) solid diffusion source, in concert with methods that are outlined above. A magnesium threshold modifying dopant region formed in accordance with either of the two methods shifted the gallium nitride/aluminum gallium nitride (GaN/AlGaN) semiconductor device threshold in the positive direction by the introduction of about 1e13 magnesium (Mg) acceptors per square centimeter on the surface of the aluminum-gallium nitride (AlGaN) barrier layer.

In the dicyclopentadienyl magnesium (Cp2Mg) vapor diffusion method, a group III nitride high electron mobility transistor (HEMT) semiconductor structure in accordance with FIG. 4F was heated in a vapor mixture of dicyclopentadienyl magnesium (Cp2Mg), ammonia (NH3) and nitrogen at a volume flow ratio of about 93.48:36:2338 standard cubic centimeters per minute, and at about 975 degrees centigrade and 2 torr for a time period of about 2 hours. During this vapor mixture exposure time, a magnesium nitride (MgN) residue layer was formed upon the group III nitride high electron mobility transistor (HEMT) semiconductor structure which was presumably molten at the temperature of about 975 degrees centigrade, and the magnesium (Mg) presumably diffused into the group III nitride high electron mobility transistor (HEMT) semiconductor structure along with compensating hydrogen. Prior to cool down of the group III nitride high electron mobility transistor (HEMT) semiconductor structure that newly included the magnesium (Mg) threshold modifying dopant region both the dicyclopentadienyl magnesium (Cp2Mg) and the ammonia (NH3) vapor sources were extinguished and the group III nitride high electron mobility transistor (HEMT) semiconductor structure was annealed at the temperature of about 975 degrees centigrade briefly in nitrogen gas only.

Subsequently, the magnesium nitride (MgN) residue layer was removed from the annealed group III nitride high electron mobility transistor (HEMT) semiconductor structure using aqueous hydrochloric acid at elevated temperature and the resulting group III nitride high electron mobility transistor (HEMT) semiconductor structure was heated in an rapid thermal annealing (RTA) apparatus in nitrogen (N2) gas at a temperature of about greater than 1000 degrees centigrade under rapid thermal annealing conditions.

In the second solid diffusion method, a composite magnesium-silicon nitride (MgSiN) dopant effusing layer comprising about 3.4 atomic percent magnesium (Mg) was deposited upon a group III nitride high electron mobility transistor (HEMT) semiconductor structure in accordance with FIG. 4F by a low pressure chemical vapor deposition (LPCVD) method. Magnesium source material, silicon source materials nitrogen source materials may be selected from appropriate alkoxides and hydrides. The resulting composite semiconductor structure was annealed at a temperature greater than about 1000 degrees centigrade as a magnesium (Mg) threshold modifying dopant drive in process step.

A pair of secondary ion mass spectroscopy (SIMS) elemental profiles for each of the group III nitride high electron mobility transistor (HEMT) semiconductor structures in accordance with the foregoing two magnesium (Mg) threshold modifying dopant region process sequence incorporation steps is shown in FIG. 5A and FIG. 5B. Each of the group III nitride high electron mobility transistor (HEMT) semiconductor structures included about 30 atomic percent aluminum (Al) in an aluminum-gallium nitride (AlGaN) barrier layer of thickness about 200 angstroms.

Within each of the elemental profile spectra diagrams of FIG. 5A and FIG. 5B, the curves from top to bottom at the right hand side of each individual spectra correspond with gallium, nitrogen, aluminum and magnesium atomic concentrations. As is seen in FIG. 5A in comparison with FIG. 5B, the dicyclopentadienyl magnesium (Cp2Mg) vapor source diffusion method (and associated MgN residue layer deposition) introduced significantly more magnesium (Mg) into the group III nitride high electron mobility transistor (HEMT) semiconductor structure than the solid source magnesium-silicon nitride (MgSiN) method that used the higher temperature rapid thermal annealing (RTA) treatment.

Figures 6A, 6B, 7:
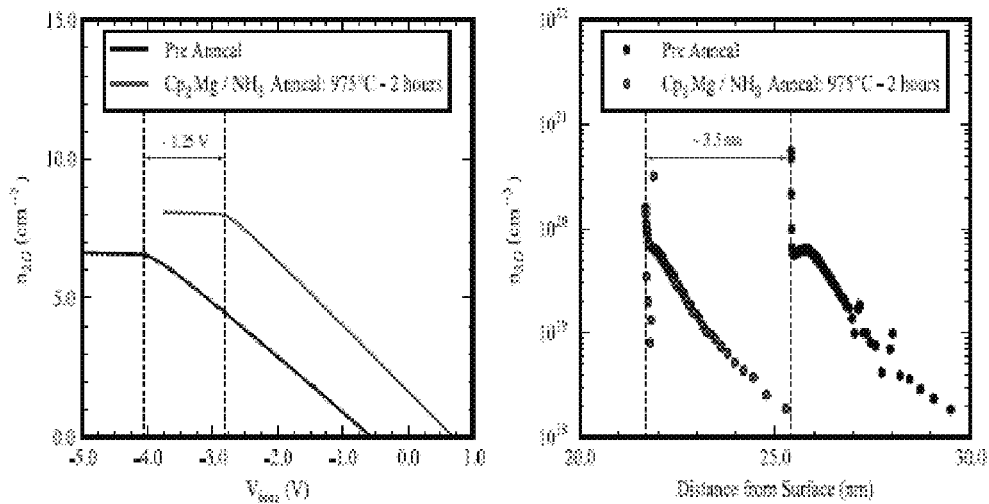
FIG. 6A shows a graph of depleted electron sheet charge density of a two dimensional electron gas (2DEG) versus bias voltage for a gated III-V semiconductor structure in accordance with the embodiments.
FIG. 6B shows a graph of charge per unit volume as a function of position for a gated III-V semiconductor structure before and after magnesium threshold modifying dopant region incorporation in accordance with the embodiments.
FIG. 7 shows an equation that may be used for calculating a threshold voltage shift for a gated III-V semiconductor structure comprising a group III nitride high electron mobility transistor (HEMT) semiconductor structure incident to magnesium threshold modifying dopant region incorporation in accordance with the embodiments.

Comparisons of sheet electron concentration versus bias voltage (CV) characteristics (measured at 1 kHz) for the foregoing group III nitride high electron mobility transistor (HEMT) semiconductor structures are shown in FIG. 6A. From the sheet electron concentration versus bias voltage plot within FIG. 6A, it is seen that the magnesium (Mg) threshold modifying dopant region (right hand curve) shifted the two dimensional electron gas (2DEG) threshold by about 1.25 volts positive while also increasing the two dimensional electron gas (2DEG) sheet charge by about 20 percent.

A volume concentration profile as a function of position graph at the right hand side of FIG. 6B suggests that a magnesium (Mg) diffusion front penetrated by roughly about 35 angstroms within the aluminum-gallium nitride (AlGaN) barrier layer within the group III nitride high electron mobility transistor (HEMT) fabricated using the dicyclopentadienyl magnesium (Cp2Mg) and ammonia (NH3) vapor diffusion method.

From the foregoing data, one might estimate a shift in a threshold voltage of a group III nitride high electron mobility transistor (HEMT) semiconductor structure with magnesium (Mg) threshold modifying dopant region incorporation while assuming that the magnesium (Mg) threshold modifying dopant region concentration is uniform (i.e., about 10e20 magnesium (Mg) dopants per cubic centimeter) and distributed over the first thickness (i.e., xd) of about 35 angstroms of an aluminum-gallium nitride (AlGaN) barrier layer of the group III nitride high electron mobility transistor (HEMT) semiconductor structure.

The change in threshold voltage may be determined using the equation of FIG. 7 which yields a reasonable estimate of positive 1.18 V threshold voltage shift in comparison with the positive 1.25 V threshold voltage shift observed in the group III nitride high electron mobility transistor (HEMT) semiconductor structure including the magnesium (Mg) threshold modifying dopant region.

Assuming that the same magnesium (Mg) threshold modifying dopant region diffusion is introduced in a lower charge structure with a gate recess leaving about 75 angstroms of an Al0.25Ga0.75N barrier layer within a group III nitride high electron mobility transistor (HEMT) semiconductor structure, a revised estimate in accordance with the equation of FIG. 7 yields a positive threshold voltage shift of about 1.5 volts, adequate for enhancement mode operation of the group III nitride high electron mobility transistor (HEMT) device that includes the magnesium threshold modifying dopant region incorporation. Furthermore, a resulting pn junction under a gate within the group III nitride high electron mobility transistor (HEMT) semiconductor structure may serve to significantly lower a gate leakage current.

Moreover, an additional experiment was undertaken with a recess at a gate location within an aluminum-gallium nitride (AlGaN) barrier layer within a high electron mobility transistor (HEMT) semiconductor structure of about 100 angstroms, followed by a brief dicyclopentadienyl magnesium (Cp2Mg) and ammonia (NH3) diffusion at about 950 degrees centigrade to yield a resulting positive threshold voltage of about 0.1 V. More aggressive dicyclopentadienyl magnesium (Cp2Mg) and ammonia (NH3) diffusions on such recessed barrier layer structures resulted in removal of the two dimensional electron gas (2DEG) as the magnesium (Mg) threshold modifying dopant region diffusion front penetrated the heterointerface between the aluminum-gallium nitride (AlGaN) barrier layer and the gallium nitride (GaN) buffer layer. Presumably, on thin barrier layer structures within a III-V semiconductor structure a threshold modifying dopant region introduction process may desirably need to be fine tuned to secure a large positive threshold voltage presumably required for enhancement mode III-V semiconductor devices.

All references, including publications, patent applications, and patents cited herein are hereby incorporated by reference in their entireties to the extent allowed and as if each reference was individually and specifically indicated to be incorporated by reference and was set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

The use of chemical formulae is not intended to indicate that materials described by the chemical formulae are necessarily stoichiometric.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. A semiconductor structure comprising:
   a barrier layer comprising a first III-V semiconductor material located upon a buffer layer comprising a second III-V semiconductor material different than the first III-V semiconductor material, the buffer layer sequentially in turn located over a substrate;
   a passivation layer comprising an aluminum-silicon nitride material having a bandgap from about 4.5 to about 6 eV and a permittivity from about $6 \times 10^{-11}$ F/m to about $8 \times 10^{-11}$ F/m at a frequency from about 1 to about 100 GHz, and located upon the barrier layer and including an aperture that exposes a threshold modifying dopant region located within the barrier layer;
   a gate contacting the threshold modifying dopant region located within the barrier layer, where the semiconductor structure does not include a field plate.

2. A semiconductor structure comprising:
   a barrier layer comprising a first III-V semiconductor material located upon a buffer layer comprising a second III-V semiconductor material different than the first III-V semiconductor material, the buffer layer sequentially in turn located over a substrate;
   a passivation layer located upon the barrier layer and including an aperture that exposes a threshold modifying dopant region located within the barrier layer;
   a gate contacting the threshold modifying dopant region within the barrier layer, where at least a portion of the passivation layer located upon the barrier layer comprises a passivation material having a bandgap from about 4.5 to about 6 eV and a permittivity from about $6 \times 10^{-11}$ F/m to about $8 \times 10^{-11}$ F/m at a frequency from about 1 to about 100 GHz, and where the semiconductor structure does not include a field plate.

3. The semiconductor structure of claim 2 further comprising a source contact and a drain contact located laterally separated by the gate and also penetrating through the passivation layer and contacting the barrier layer, but not the threshold modifying dopant region within the barrier layer.

4. The semiconductor structure of claim 2 wherein the passivation material having the bandgap from about 4.5 to about 6 eV and the permittivity from about $6 \times 10^{-11}$ F/m to about 8×10^-11 F/m at a frequency from about 1 to about 100 GHz comprises an aluminum-silicon nitride passivation material.

5. The semiconductor structure of claim 2 wherein each of the buffer layer and the barrier layer comprises a III-V semiconductor material other than a group III nitride semiconductor material.

6. The semiconductor structure of claim 2 wherein each of the buffer layer and the barrier layer comprises a group III nitride semiconductor material.

7. The semiconductor structure of claim 2 wherein the threshold modifying dopant region includes a threshold modifying dopant selected from the group consisting of magnesium and beryllium threshold modifying dopants.

8. A semiconductor structure comprising:
   a barrier layer comprising a first III-V semiconductor material located upon a buffer layer comprising a second III-V semiconductor material different than the first III-V semiconductor material, the buffer layer sequentially in turn located over a substrate;
   a passivation layer located upon the barrier layer and including an aperture that exposes symmetrically aligned with the aperture a threshold modifying dopant region within the barrier layer;
   a source contact and a drain contact separated by the aperture and penetrating through the passivation layer and contacting the barrier layer but not the threshold modifying dopant region within the barrier layer;
   a gate located in the aperture and contacting the threshold modifying dopant region within the barrier layer, where at least a portion of the passivation layer located upon the barrier layer comprises a passivation material having a bandgap from about 4.5 to about 6 eV and a permittivity from about 6×10^-11 F/m to about 8×10^-11 F/m at a frequency from about 1 to about 100 GHz, and further where the semiconductor structure does not include a field plate.

9. The semiconductor structure of claim 8 wherein the passivation material having the bandgap from about 4.5 to about 6 eV and the permittivity from about 6×10^-11 F/m to about 8×10^-11 F/m at a frequency from about 1 to about 100 GHz comprises an aluminum-silicon nitride passivation material.

10. The semiconductor structure of claim 8 wherein each of the buffer layer and the barrier layer comprises a group III nitride semiconductor material.

11. The semiconductor structure of claim 8 wherein the threshold modifying dopant region includes a threshold modifying dopant selected from the group consisting of magnesium and beryllium threshold modifying dopants.

12. A method for fabricating a semiconductor structure comprising:
   forming a layered structure comprising:
      a buffer layer comprising a first III-V semiconductor material formed over a substrate;
      a barrier layer comprising a second III-V semiconductor material different from the first III-V semiconductor material formed upon the buffer layer; and
      a passivation layer comprising an aluminum-silicon nitride passivation material having a bandgap from about 4.5 to about 6 eV and a permittivity from about 6×10^-11 F/m to about 8×10^-11 F/m at a frequency from about 1 to about 100 GHz formed upon the barrier layer;
   patterning a portion of the passivation layer located upon the barrier layer to provide an aperture that exposes a portion of the barrier layer;
   forming a threshold modifying dopant region into the barrier layer at the base of the aperture; and
   forming a gate contacting the threshold modifying dopant region, where the semiconductor structure does not include a field plate formed over the substrate.

13. A method for fabricating a semiconductor structure comprising:
   forming a layered structure comprising:
      a buffer layer comprising a first III-V semiconductor material formed over a substrate;
      a barrier layer comprising a second III-V semiconductor material different from the first III-V semiconductor material formed upon the buffer layer; and
      a passivation layer comprising a passivation material having a bandgap from about 4.5 to about 6 eV and a permittivity from about 6×10^-11 F/m to about 8×10^-11 F/m at a frequency from about 1 to about 100 GHz upon the barrier layer;
   patterning a portion of the passivation located upon the barrier layer to provide an aperture that exposes a portion of the barrier layer;
   forming a threshold modifying dopant region into the barrier layer at the base of the aperture; and
   forming a gate contacting the threshold modifying dopant region, where the semiconductor structure does not include a field plate formed over the substrate.

14. The method of claim 13 wherein each of the first III-V semiconductor material and the second III-V semiconductor material layer comprises other than a group III nitride semiconductor material.

15. The method of claim 13 wherein each of the first III-V semiconductor material and the second III-V semiconductor material comprises a group III nitride semiconductor material.

16. The method of claim 13 wherein the forming the threshold modifying dopant region uses a vapor diffusion dopant source.

17. The method of claim 16 wherein the vapor diffusion dopant source comprises dicyclopentadienyl magnesium.

18. The method of claim 13 wherein the forming the threshold modifying dopant region uses a solid diffusion dopant source.

19. The method of claim 18 wherein the solid diffusion dopant source comprises magnesium-silicon nitride.

20. The method of claim 13 wherein the threshold modifying dopant region comprises a threshold modifying dopant selected from the group consisting of magnesium and beryllium threshold modifying dopants.

21. The semiconductor structure of claim 1 wherein the aluminum-silicon-nitride material has:
   an aluminum content from about 0.1 to about 25 atomic percent;
   a silicon content from about 25 to about 55 atomic percent; and
   a nitrogen content from about 40 to about 60 atomic percent.

22. The semiconductor structure of claim 4 wherein the aluminum-silicon-nitride material has:
   an aluminum content from about 0.1 to about 25 atomic percent;
   a silicon content from about 25 to about 55 atomic percent; and
   a nitrogen content from about 40 to about 60 atomic percent.

23. The semiconductor structure of claim 9 wherein the aluminum-silicon-nitride material has:
- an aluminum content from about 0.1 to about 25 atomic percent;
- a silicon content from about 25 to about 55 atomic percent; and
- a nitrogen content from about 40 to about 60 atomic percent.

24. The method of claim 12 wherein the aluminum-silicon-nitride material has:
- an aluminum content from about 0.1 to about 25 atomic percent;
- a silicon content from about 25 to about 55 atomic percent; and
- a nitrogen content from about 40 to about 60 atomic percent.

* * * * *